(12) United States Patent
Monfray et al.

(10) Patent No.: US 9,184,295 B2
(45) Date of Patent: Nov. 10, 2015

(54) METHOD FOR MANUFACTURING A SUSPENDED MEMBRANE AND DUAL-GATE MOS TRANSISTOR

(71) Applicant: STMicroelectronics (Crolles 2) SAS, Crolles (FR)

(72) Inventors: Stéphane Monfray, Eybens (FR); Thomas Skotnicki, Crolles-Monfort (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 2 days.

(21) Appl. No.: 14/077,724

(22) Filed: Nov. 12, 2013

(65) Prior Publication Data
US 2014/0070317 A1    Mar. 13, 2014

Related U.S. Application Data

(62) Division of application No. 12/949,286, filed on Nov. 18, 2010, now Pat. No. 8,586,445.

(30) Foreign Application Priority Data

Nov. 23, 2009 (FR) ..................... 09 58280

(51) Int. Cl.
*H01L 29/786* (2006.01)
(52) U.S. Cl.
CPC ........ *H01L 29/786* (2013.01); *H01L 29/78648* (2013.01)

(58) Field of Classification Search
USPC ................................. 438/338–340
See application file for complete search history.

(56) References Cited

U.S. PATENT DOCUMENTS

| 7,015,147 | B2 | 3/2006 | Lee et al. |
| 7,547,641 | B2 * | 6/2009 | Ieong et al. ................... 438/739 |
| 2002/0135020 | A1 | 9/2002 | Skotnicki et al. |
| 2009/0032874 | A1 | 2/2009 | Loubet et al. |
| 2012/0037880 | A1 * | 2/2012 | Bangsaruntip et al. ........... 257/9 |

FOREIGN PATENT DOCUMENTS

| FR | 2901058 | 11/2007 |
| JP | 2007134366 | 5/2007 |

OTHER PUBLICATIONS

French Search Report dated Apr. 19, 2010 from French Patent Application 09/58280 filed Nov. 23, 2009.

* cited by examiner

*Primary Examiner* — Matthew W Such
*Assistant Examiner* — Robert Carpenter
(74) *Attorney, Agent, or Firm* — Seed IP Law Group PLLC

(57) ABSTRACT

A method for manufacturing a suspended membrane in a single-crystal semiconductor substrate, including the steps of: forming in the substrate an insulating ring delimiting an active area, removing material from the active area, successively forming in the active area a first and a second layers, the second layer being a single-crystal semiconductor layer, etching a portion of the internal periphery of said ring down to a depth greater than the thickness of the second layer, removing the first layer so that the second layer formed a suspended membrane anchored in the insulating ring.

13 Claims, 4 Drawing Sheets

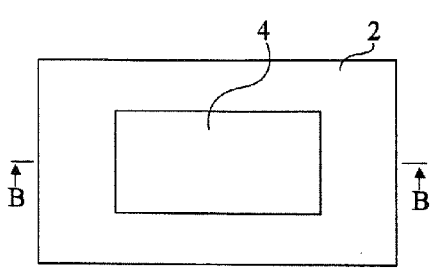
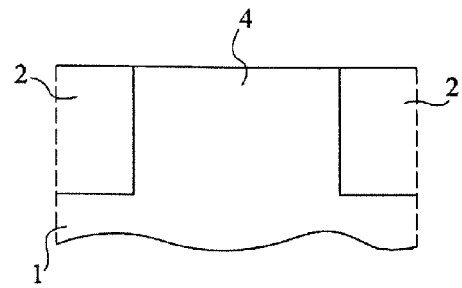
Fig 1A
PRIOR ART
Fig 1B
PRIOR ART
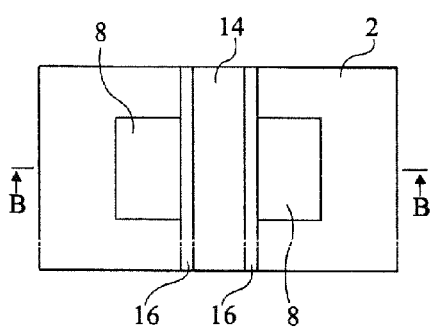
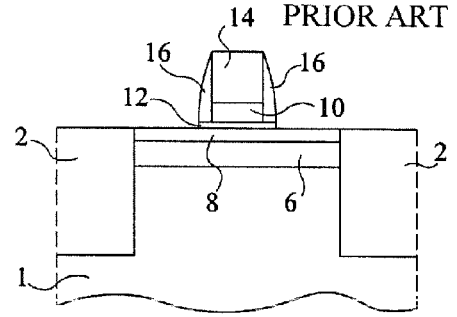
Fig 2A
PRIOR ART
Fig 2B
PRIOR ART
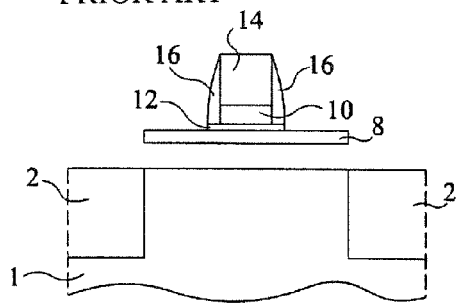
Fig 3B
PRIOR ART
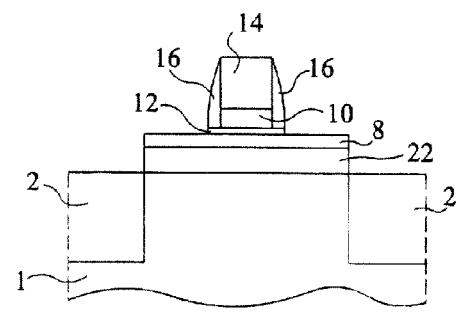
Fig 4B
PRIOR ART

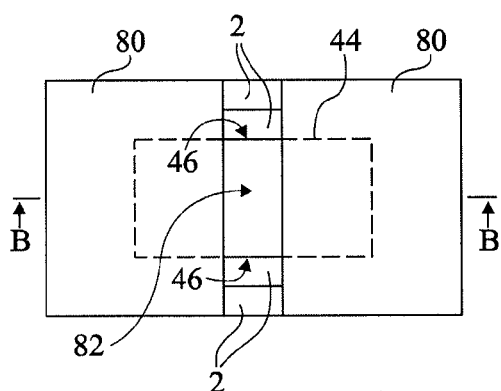
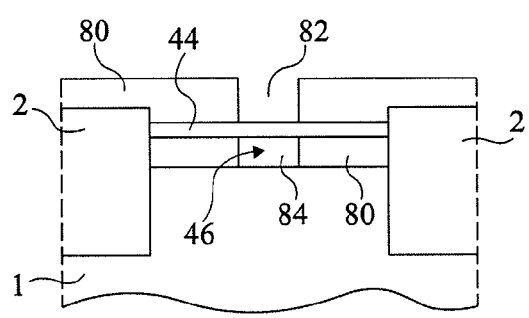
Fig 8A                    Fig 8B
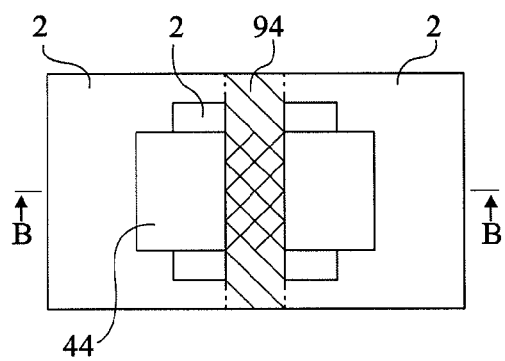
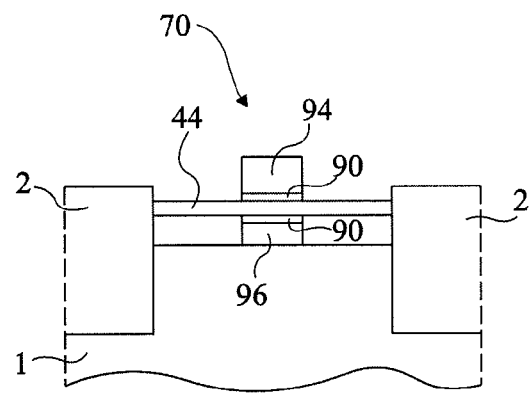
Fig 9A                    Fig 9B

METHOD FOR MANUFACTURING A SUSPENDED MEMBRANE AND DUAL-GATE MOS TRANSISTOR

CROSS REFERENCE TO RELATED APPLICATIONS

This application is a continuation of U.S. patent application Ser. No. 12/949,286, filed on Nov. 18, 2010, which claims the priority benefit of French patent application number 09/58280, filed on Nov. 23, 2009, which applications are hereby incorporated by reference to the maximum extent allowable by law.

BACKGROUND OF THE INVENTION

1. Field of the Invention

The present invention relates to integrated circuits. It more specifically relates to methods for manufacturing electronic components designated as SON in the art (for Silicon On Nothing).

2. Discussion of the Related Art

MOS transistors are currently formed on an SOI-type substrate (for Silicon On Insulator). Since the cost of this substrate is not negligible, it has been provided to locally form, in a solid substrate, a buried silicon oxide layer under a single-crystal silicon film on which the transistor will be formed.

FIGS. 1A to 4B illustrate successive steps of the forming of a MOS transistor on a portion of a substrate comprising a buried silicon oxide layer.

FIGS. 1A and 1B respectively are a top view and a cross-section view along plane BB of FIG. 1A of an initial manufacturing step. In a solid silicon substrate 1, an insulating ring 2 delimiting an active area 4 has been formed.

At the step illustrated in FIGS. 2A and 2B, which respectively are a top view and a cross-section view along plane BB of FIG. 2A, active area 4 has been etched down to a given depth before the successive epitaxial forming of a silicon-germanium sacrificial layer 6 and of a silicon layer 8 across a thickness corresponding to the etch depth. A gate insulator 12 has been deposited on layer 8, after which a metal gate 10 has been formed. The upper portion of the gate comprises a polysilicon layer 14. Two spacers 16 are formed on either side of gate 10-14. As illustrated in FIG. 2A, gate 10-14 extends on insulating ring 2, on either side of active area 4.

At the step illustrated in FIG. 3B, which is a cross-section view of a next manufacturing step, insulating ring 2 has been etched to be able to access to sacrificial layer 6. Then, layer 6 has been removed. The mechanical resistance of the suspended membrane corresponding to layer 8 is ensured by the extensions of gate 10-14 which bear on insulating ring 2.

At the step illustrated in FIG. 4B, which is a cross-section view of a next manufacturing step, a silicon oxide layer 22 has been deposited under layer 8. A MOS transistor, which is insulated from substrate 1 by layer 22, can then be formed in silicon layer 8. Such a transistor has the same advantages as a transistor formed in the upper silicon layer of an SOI-type structure.

In this example, the selective etching of sacrificial layer 6 over layer 8 is performed after the forming of gate 10-14. A hydrogen chloride gas at high temperature used for this step inevitably etches metal gate 10, which may be a problem. Further, the etch selectivity over spacers 16 and to gate insulator 12 is not perfect.

SUMMARY OF THE INVENTION

An object of an embodiment of the present invention is to provide a method for manufacturing a MOS transistor on an insulator avoiding at least some of the disadvantages of prior art methods.

A more general object of an embodiment of the present invention is to provide a method for manufacturing a suspended membrane which is simple to implement.

A more specific object of an embodiment of the present invention is to provide a method for manufacturing a dual-gate MOS transistor.

Thus, an embodiment of the present invention provides a method for manufacturing a suspended membrane in a single-crystal semiconductor substrate, comprising the steps of:

forming, in the substrate, an insulating ring delimiting an active area, removing material from the active area, successively forming, in the active area, a first and a second layers, the second layer being a single-crystal semiconductor layer, etching a portion of the internal periphery of said ring down to a depth greater than the thickness of the second layer, removing the first layer so that the second layer forms a suspended membrane anchored in the insulating ring.

According to another embodiment of the present invention, the etch depth substantially corresponds to the depth that material has been removed from the active area.

According to another embodiment of the present invention, the thickness of the first layer ranges between 10 and 50 nm, preferably between 15 and 25 nm, and the thickness of the second layer ranges between 2 and 20 nm, preferably between 5 and 10 nm, the etch depth ranging between 4 and 100 nm, preferably between 10 and 40 nm.

Another embodiment of the present invention provides a method for forming a dual-gate MOS transistor comprising the steps of:

implementing the above-described method, depositing a resin layer on and under the membrane, irradiating the resin layer with an electron beam or with extreme ultraviolet radiations and developing the resin layer to form in the resin layer an upper trench on the membrane and a lower trench under the membrane, the two trenches being aligned and the lower trench emerging on the etched internal periphery of the insulating ring, depositing an insulated gate conductor in the trenches on and under the membrane, eliminating the irradiated resin layer.

According to another embodiment of the present invention, the resin layer transforms into silicon oxide after the irradiation step and after an anneal step.

According to another embodiment of the present invention, a gate insulation layer is formed on and under the membrane before the deposition of the resin layer.

According to another embodiment of the present invention, the gate insulation layer is hafnium oxide.

Another embodiment of the present invention provides a device comprising an active area formed in a single-crystal semiconductor substrate delimited by an insulating ring, the ring having at least two different thicknesses, the difference between the two thicknesses corresponding to an etch depth in a portion of the internal periphery of said ring, the active area comprising a suspended membrane have sides solid with the insulation region.

According to another embodiment of the present invention, the device comprises upper and lower insulated gate conductors, respectively arranged on and under the membrane, the membrane comprising source and drain regions.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 1A and 2A, previously described, are simplified top views illustrating the initial steps of a method for manufacturing a MOS transistor;

FIGS. 1B and 2B, previously described, are simplified cross-section views along plane BB of FIGS. 1A and 2A;

FIGS. 3B and 4B, previously described, are simplified cross-section views illustrating steps of the MOS transistor manufacturing method;

FIGS. 8A and 9A are simplified top views illustrating a method for manufacturing a dual-gate MOS transistor; and FIGS. 8B and 9B are simplified cross-section views along plane BB, respectively of FIGS. 8A and 9A.

DETAILED DESCRIPTION

Figure 5A:
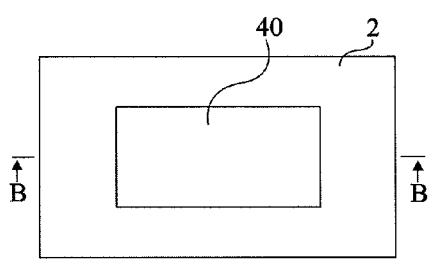
FIGS. 5A and 6A are simplified top views illustrating the initial steps of a method for manufacturing a suspended membrane according to an embodiment of the present invention.

For clarity, the same elements have been designated with the same reference numerals in the different drawings and, further, as usual in the representation of integrated circuits, the various drawings are not to scale.

Figure 5B:
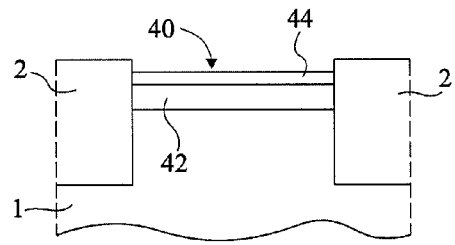
FIGS. 5B and 6B are simplified cross-section views along plane BB, respectively of FIGS. 5A and 6A.

FIGS. 5A and 5B show a solid substrate 1 made of a single-crystal semiconductor material, for example, silicon, in which an insulating ring 2 delimiting an active area 40 have formed. Insulating ring 2, for example, is silicon oxide. Material is removed from active area 40 by partial etching of the silicon, for example, by a hydrogen chloride gas at high temperature down to a depth lower than that of the insulating ring. A sacrificial layer 42, for example, made of silicon-germanium, followed by a single-crystal semiconductor layer 44, for example, made of silicon, have been epitaxially formed. The upper surface of layer 44 is at the level of the upper surface of insulating ring 2 or slightly below. The thickness of sacrificial layer 42 for example ranges between 10 and 50 nm, preferably between 15 and 25 nm. The thickness of layer 44 for example ranges between 2 and 20 nm, preferably between 5 and 10 nm.

Figure 6A:
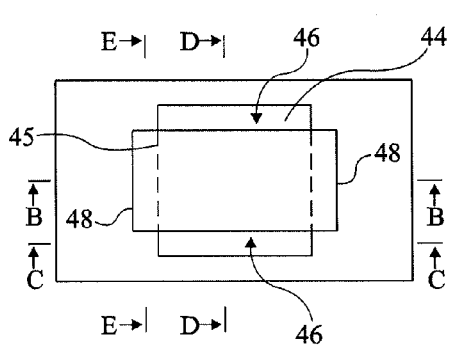
Figure 6B:
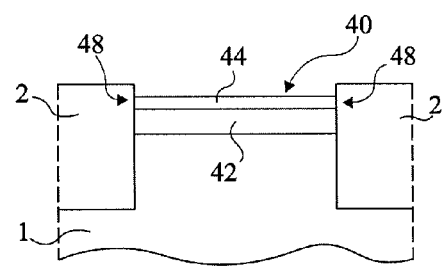
Figure 6C:
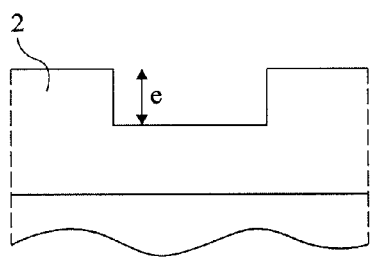
FIGS. 6C, 6D, and 6E are simplified cross-section views along planes CC, DD, and EE of FIG. 6A.
Figure 6D:
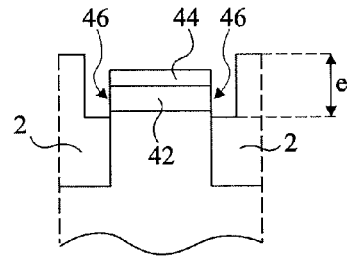
Figure 6E:
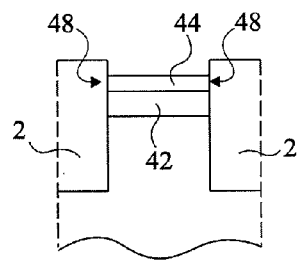

FIGS. 6A to 6E show the result of a step during which a portion of the internal periphery of insulating ring 2 has been selectively etched. This selective etching is performed in the opening of a mask 45. In a first direction, horizontal in FIG. 6A, opening 45 is narrower than active area 40. In a second direction, vertical in FIG. 6A, opening 45 is wider than active area 40. Vertically opposite portions of the periphery of the active area have thus been etched to form accesses 46. Thus, horizontally opposite sides 48 of layer 44 are in contact with insulating ring 2 and are solid therewith, as can be seen in FIGS. 6A, 6B, and 6E.

As illustrated in FIG. 6D, etch depth e is greater than the thickness of layer 44. This enables forming lateral accesses 46 to sacrificial layer 42. In FIGS. 6A to 6E, etch depth e substantially corresponds to the digging depth of active area 40. Thus, accesses 46 to layer 42 are free across the entire thickness of this layer. Depth e of the etching ranges between 4 and 100 nm, preferably between 10 and 40 nm.

As an example, the etching of insulating ring 2 may be performed by wet process by using, for example, a hydrofluoric acid solution or by plasma by using, for example, a $C_4H_8$ plasma.

Figure 7B:
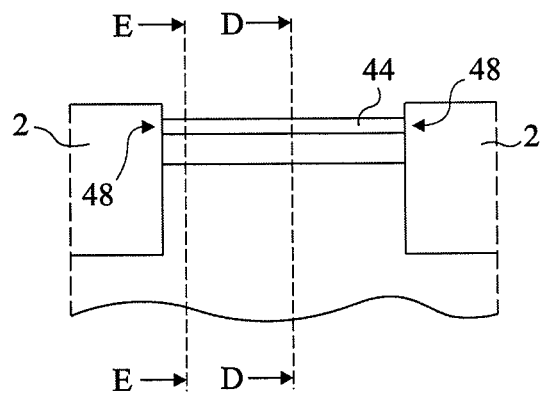
FIG. 7B is a simplified cross-section view illustrating steps of a method for manufacturing a membrane.
Figure 7D:
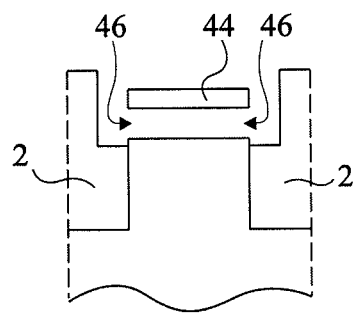
FIGS. 7D and 7E are simplified cross-section views respectively along planes DD and EE of FIG. 7B.
Figure 7E:
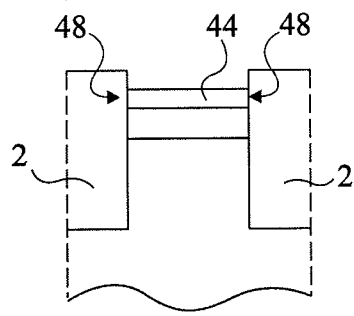

FIGS. 7B, 7D, and 7E are cross-section views, illustrating a step of the method for manufacturing a suspended membrane, which respectively corresponds to the cross-section views of 6B, 6D, and 6E. These drawings show the result of a step during which sacrificial layer 42 has been removed. Layer 44 thus forms a suspended membrane. The etching of layer 44 has been performed laterally through accesses 46, as can be seen in FIG. 7D. As an example, it has been possible to perform a dry etching by, for example, using a hydrogen chloride gas at high temperature, or a plasma etching by, for example, using a $CF_4$ plasma. The suspended membrane is solid with insulating ring 2 at its opposite sides 48. The mechanical resistance of membrane 44 is obtained by anchoring of edges 48 in the non-etched portion of insulating ring 2.

According to an aspect of an embodiment of the present invention, an insulating layer is deposited under membrane 44. The insulating layer may, for example, be silicon oxide. As an example, it may be provided to deposit this layer by chemical vapor deposition, currently designated as CVD in the art.

It may then be provided to form a gate on an insulating layer deposited on membrane 44. Source and drain regions are then formed on either side of the channel region formed in membrane 44. A MOS transistor is thus obtained on a portion of the substrate locally of silicon-on-insulator type. The gate being formed after removal of sacrificial layer 42, the different transistor elements are not affected by the etching of this sacrificial layer.

The method described in relation with FIGS. 5A to 7E may also be applied to the forming of a dual-gate MOS transistor.

FIGS. 8A to 9B illustrate steps of the implementation of a method for forming a dual-gate MOS transistor 70.

FIGS. 8A and 8B show in top view and in cross-section view the device of FIGS. 7B-7E in which, after forming of suspended membrane 44, a resin 80 has been deposited on and under membrane 44. Advantageously, resin 80 is a resin of HSQ resin type (Hydrogen SilsesQuioxane) or of PMMA resin type (polymethyl methacrylate). After being irradiated by an electron beam, developed and annealed, the resin transforms into silicon oxide.

In resin 80, an upper trench 82 has been formed on the membrane and a low trench 84 has been formed under the membrane, as shown in FIG. 8B. The two trenches are aligned. The trenches emerge on the etched internal periphery of ring 2. Thus, two access portions 46 not filled with resin 80 provide access to trench 84. As illustrated in FIG. 8A, both access portions 46 are formed vertically, opposite with respect to membrane 44. Trenches 82 and 84 have been formed by a step of lithography by electron beam or by extreme ultraviolet radiations. The thickness of membrane 44, advantageously ranging between 2 and 20 nm, preferably between 5 and 10 nm, is sufficiently small to enable the irradiation by the electron beam or by the extreme ultraviolet radiations of resin 80 arranged under the membrane. Resin 80 has then been developed, after which the resin has been annealed.

In FIGS. 9A and 9B, a gate insulator 90 has been deposited or grown on and under membrane 44 through access portions 46 in each of trenches 82 and 84. As an example, the gate insulator may be silicon oxide or hafnium oxide. As can be seen in FIG. 9B, a conductive material has then been deposited, to form an upper insulated gate 94 above the membrane and a lower insulated gate 96 under the membrane. As illustrated in FIG. 9A, upper gate 94 symbolized by a simple hatching extends under insulating ring 2 on either side of membrane 44, while lower gate 96, symbolized by a double hatching, only extends under membrane 44.

As an example, conductive gates 94 and 96 are made of titanium nitride. Since the conductor is only useful for the interface with the gate oxide, a low conductor thickness is sufficient. The gate, and thus the trenches, have then been completed with a polysilicon layer. For this purpose, a so-called damascene method has been used, where polysilicon has been deposited on layer 80 to fill trenches 82 and 84. The polysilicon layer protruding from trench 82 has undergone a chem.-mech. polishing all the way to silicon oxide layer 80, which forms a stop layer. Layer 80 has then been removed, for example, with a hydrofluoric acid solution. Gate insulation layer 90 advantageously is hafnium oxide. Thus, the etching of silicon oxide layer 80 is selective over gate insulation layer 90.

The source and drain regions have been formed in membrane 44, on either side of the channel region interposed between the two insulated gates 94 and 96.

This method provides a dual-gate MOS transistor 70, its two gates being self-aligned.

As a variation, it may be provided to form a gate insulation layer on and under membrane 44 before depositing resin layer 80. Thus, this layer will be used as a stop layer against the etching of layer 80 once it has been irradiated, developed, and annealed.

Specific embodiments of the present invention have been described. Different variations and modifications will occur to those skilled in the art. In particular, the gates of dual-gate transistor 70 may be integrally made of polysilicon. Further, the two insulated upper and lower layers 94 and 96 may be interconnected by the deposition of a gate material coating membrane 44.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising an active area formed in a single-crystal semiconductor substrate delimited by an insulating ring, the ring comprising at least two different thicknesses, the difference between the two thicknesses corresponding to an etch depth in a portion of an internal periphery of said ring, the active area comprising a suspended membrane having sides solid with the insulating ring, upper and lower insulated gate conductors, respectively arranged on and under the suspended membrane, the suspended membrane comprising source and drain regions.

2. The device of claim 1, wherein first opposite sides of the suspended membrane are secured to the insulating ring and wherein second opposite sides of the suspended membrane are spaced from the internal periphery of the insulating ring.

3. The device of claim 1, wherein the suspended membrane has a thickness in a range of 2 to 20 nm.

4. The device of claim 1, wherein the upper and lower insulated gate conductors are separated from the suspended membrane by a gate insulation layer of hafnium oxide.

5. The device of claim 1, wherein the suspended membrane is a single crystal semiconductor layer.

6. A semiconductor device comprising:
    a substrate;
    an insulating ring on the substrate and surrounding an active area;
    a suspended layer that is spaced from the substrate, that is anchored to the insulating ring on first opposite sides of the suspended layer and that is spaced from the insulating ring on second opposite sides of the suspended layer;
    upper and lower insulated gates on respective upper and lower surfaces of the suspended layer; and
    source and drain regions in the suspended layer to define a dual-gate MOS transistor.

7. The semiconductor device as defined in claim 6, wherein the insulating ring has a first thickness on the first opposite sides of the suspended layer and a second thickness, less than the first thickness, on the second opposite sides of the suspended layer.

8. The semiconductor device as defined in claim 6, wherein the insulating ring has an inner periphery that defines the active area and wherein the inner periphery of the insulating ring is spaced from the suspended layer on the second opposite sides of the suspended layer.

9. The semiconductor device as defined in claim 6, wherein the suspended layer has a thickness of 2 to 20 nm.

10. The semiconductor device as defined in claim 6, wherein the suspended layer is a single crystal semiconductor layer.

11. The semiconductor device as defined in claim 6, further comprising upper and lower insulated gates formed on respective upper and lower surfaces of the suspended layer, and source and drain regions formed in the suspended layer to define a dual-gate MOS transistor.

12. A semiconductor device as defined in claim 6, wherein an insulator of the insulated gate is hafnium oxide.

13. A semiconductor device as defined in claim 11, wherein insulators of the upper and lower insulated gates are hafnium oxide.

* * * * *